(12) United States Patent
Sasaki et al.

(10) Patent No.: US 9,337,399 B2
(45) Date of Patent: May 10, 2016

(54) PHOSPHOR AND LIGHT-EMITTING DEVICE

(71) Applicant: Koito Manufacturing Co., Ltd., Tokyo (JP)

(72) Inventors: Yasutaka Sasaki, Shizuoka (JP); Hisayoshi Daicho, Shizuoka (JP); Shinobu Aoyagi, Nagoya (JP); Hiroshi Sawa, Nagoya (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/529,788

(22) Filed: Oct. 31, 2014

(65) Prior Publication Data
US 2015/0048406 A1  Feb. 19, 2015

Related U.S. Application Data

(62) Division of application No. 13/516,774, filed as application No. PCT/JP2010/006793 on Nov. 19, 2010, now abandoned.

(30) Foreign Application Priority Data

Dec. 21, 2009 (JP) ................... 2009-289201
Oct. 15, 2010 (JP) ................... 2010-232699

(51) Int. Cl.
*H01L 29/49* (2006.01)
*H01L 33/50* (2010.01)
(Continued)

(52) U.S. Cl.
CPC .......... *H01L 33/504* (2013.01); *C09K 11/7734* (2013.01); *C09K 11/7739* (2013.01);
(Continued)

(58) Field of Classification Search
CPC ................ H01L 33/504; H01L 33/502; H01L 224/45139; H01L 2224/73265
See application file for complete search history.

(56) References Cited

U.S. PATENT DOCUMENTS

2007/0125982 A1  6/2007  Tian et al.
2009/0015138 A1  1/2009  Daicho et al.
(Continued)

FOREIGN PATENT DOCUMENTS

CN  101100605 A  1/2008
CN  101160371 A  4/2008
(Continued)

OTHER PUBLICATIONS

Office Action issued in corresponding Chinese Application No. 201080058464.8 on Aug. 21, 2014 (12 pages).
(Continued)

*Primary Examiner* — Michael Shingleton
(74) *Attorney, Agent, or Firm* — Buchanan Ingersoll & Rooney PC (57) ABSTRACT

A phosphor has the general formula $(M^2{}_x, M^3{}_y, M^4{}_z)_m M^1 O_3 X_{(2/n)}$, wherein $M^1$ represents at least one element including at least Si and selected from the group consisting of Si, Ge, Ti, Zr, and Sn, $M^2$ represents at least one element including at least Ca and selected from the group consisting of Ca, Mg, Cd, Co, and Zn, $M^3$ represents at least one element including at least Sr and selected from the group consisting of Sr, Ra, Ba, and Pb, X represents at least one halogen element, $M^4$ represents at least one element including at least $Eu^{2+}$ and selected from the group consisting of rare-earth elements and Mn, m is in the range $1 \leq m \leq 4/3$, n is in the range $5 \leq n \leq 7$, and x, y, and z are each in such a range as to satisfy $x+y+z=1$, $0.45 \leq x \leq 0.8$, $0.05 \leq y \leq 0.45$, and 0.45, and $0.03 \leq z \leq 0.35$.

4 Claims, 9 Drawing Sheets

(51) Int. Cl.
  *C09K 11/77* (2006.01)
  *H05B 33/14* (2006.01)
(52) U.S. Cl.
  CPC .............. *H05B33/14* (2013.01); *H01L 33/502* (2013.01); *H01L 2224/45139* (2013.01); *H01L 2224/45144* (2013.01); *H01L 2224/48091* (2013.01); *H01L 2224/73265* (2013.01)

(56) References Cited

U.S. PATENT DOCUMENTS

2009/0058254 A1 3/2009 Okuyama et al.
2009/0218926 A1 9/2009 Shiraishi et al.

FOREIGN PATENT DOCUMENTS

| CN | 101336279 A | 12/2008 |
|---|---|---|
| CN | 101575511 A | 11/2009 |
| EP | 2280054 A2 | 2/2011 |
| FR | 2917748 A1 | 12/2008 |
| JP | 2008-274240 A | 11/2008 |
| JP | 2009-38348 A | 2/2009 |
| KR | 10-2009-0006790 A | 1/2009 |
| WO | 2007/080555 A1 | 7/2007 |
| WO | WO 2007/135926 A1 | 11/2007 |
| WO | WO 2008/020913 A2 | 2/2008 |
| WO | WO 2008/042740 A1 | 4/2008 |

OTHER PUBLICATIONS

Office Action (Notification of Reason(s) for Refusal) issued on Nov. 28, 2013, by the Korean Patent Office in corresponding Korean Patent Application No. 10-2012-7018499, and an English Translation of the Office Action. (7 pages).
Office Action (The First Office Action) issued on Dec. 6, 2013. by the Chinese Patent Office in corresponding Chinese Patent Application No. 201080058464.8, and an English Translation of the Office Action. (13 pages).
Japanese Patent Office, International Search Report, Jan. 18, 2011, 4 Pages.
WIPO, International Preliminary Report on Patentability, Jul. 10, 2012, 7 Pages.
Int'l Search Report, PCT/JP2010/006793, Nov. 19, 2010.
Extended Search Report issued on Mar. 12, 2015 by the European Patent Office, in corresponding European Patent Application No. 10838877.8 (8 pages).
Office Action issued on Apr. 7, 2015, by the Chinese Patent Office in corresponding Chinese Patent Application No. 201080058464.8, and an English Translation of the Office Action. (10 pages).

PHOSPHOR AND LIGHT-EMITTING DEVICE

CROSS-REFERENCE TO RELATED APPLICATIONS

This application is a divisional of U.S. patent application Ser. No. 13/516,774, filed on Jun. 18, 2012, which is based upon and claims the benefit of priority from the prior Japanese Patent Application No. PCT/JP2010/006793, filed on Nov. 19, 2010, Japanese Patent Application No. 2010-0232699, filed on Oct. 15, 2010, and Japanese Patent Application No. 2009-0289201, filed on Dec. 21, 2009, the entire contents of which are incorporated herein by reference.

BACKGROUND OF THE INVENTION

1. Field of the Invention

The invention relates to a phosphor (fluorescent material) which is excited efficiently by ultraviolet light or short-wavelength visible light to emit light, and to a light-emitting device produced therewith.

2. Description of the Related Art

A variety of light-emitting devices are known, which are configured to produce light of the desired color by using a combination of a light-emitting element and phosphors which are excited by the light emitted from the light-emitting element and producing light in a wavelength region different from that of the light-emitting element.

In recent years, particular attention has been paid to white light-emitting devices with long life and low power consumption, which are configured to produce white light by using a combination of a semiconductor light-emitting element such as a light-emitting diode (LED) or a laser diode (LD) which emits ultraviolet light or short-wavelength visible light and phosphors which use the light-emitting element as an excitation light source.

Known examples of such white light-emitting devices include systems using a combination of an LED which emits ultraviolet light or short-wavelength visible light and different phosphors which are excited by ultraviolet light or short-wavelength visible light to emit light beams of colors such as blue and yellow, respectively (see Patent Document 1).

[Patent Document 1] Japanese Patent Application (Laid-Open) No. 2009-38348

SUMMARY OF THE INVENTION

Unfortunately, the light-emitting devices described, above tend to have a color temperature higher than that achieved by traditional incandescent or fluorescent lamps. Therefore, further improvement has been required for use of the above white light-emitting devices as indoor lighting devices in houses, stores, etc.

The invention has been made in view of such circumstances, and a general purpose of the invention is to provide a phosphor applicable for use in light-emitting devices for emitting warm light.

In order to solve the above problem, there is provided, a phosphor having the general formula $(M^2_x, M^3_y, M^4_z)_m M^1 O_3 X_{(2/n)}$, wherein $M^1$ represents at least one element including at least Si and selected from the group consisting of Si, Ge, Ti, Zr, and Sn, $M^2$ represents at least one element including at least Ca and selected from the group consisting of Ca, Mg, Cd, Co, and Zn, $M^3$ represents at least one element including at least Sr and selected from the group consisting of Sr, Ra, Ba, and Pb, X represents at least one halogen element, $M^4$ represents at least one element including at least $Eu^{2+}$ and selected from the group consisting of rare-earth elements and Mn, m is in the range $1 \leq m \leq 4/3$, n is in the range $5 \leq n \leq 7$, and x, y, and z are each in such a range as to satisfy $x+y+z=1$, $0.45 \leq x \leq 0.8$, $0.05 \leq y \leq 0.45$, and $0.03 \leq z \leq 0.35$.

According to this embodiment, a white LED which emits light of incandescent color at 3200, K or less can be typically configured using a combination of the phosphor and a blue phosphor and a blue light-emitting element.

Another embodiment of the invention is a light-emitting device. The light-emitting device is a light-emitting device configured to include: a light-emitting element which emits ultraviolet light or short-wavelength visible light; a first phosphor which is excited by the ultraviolet light or the short-wavelength visible light to emit visible light; and a second phosphor which is excited by the ultraviolet light or the short-wavelength visible light to emit visible light of a color different from that of the visible light emitted from the first phosphor, the light-emitting device being configured to produce a mixed color by mixing light beams from the respective phosphors. The first phosphor has the general formula $(M^2_x, M^3_y, M^4_z)_m M^1 O_3 X_{(2/n)}$, wherein $M^1$ represents at least one element including at least Si and selected from the group consisting of Si, Ge, Ti, Zr, and Sn, $M^2$ represents at least one element including at least Ca and selected from the group consisting of Ca, Ma, Cd, Co, and Zn, $M^3$ represents at least one element including at least Sr and selected from the group consisting of Sr, Ra, Ba, and Pb, X represents at least one halogen element, $M^4$ represents at least one element including at least $Eu^{2+}$ and selected from the group consisting of rare-earth elements and Mn, m is in the range $1 \leq m \leq 4/3$, n is in the range $5 \leq n \leq 7$, and x, y, and z are each in such a range as to satisfy $x+y+z=1$, $0.45 \leq x \leq 0.8$, $0.05 \leq y \leq 0.45$, and $0.03 \leq z \leq 0.35$.

According to this embodiment, a light-emitting device which emits light of incandescent color at 3,200 K or less can be achieved with relative ease.

Another embodiment of the invention is also a light-emitting device. The light-emitting device is configured to include a semiconductor light-emitting element which emits ultraviolet light or short-wavelength visible light; a first phosphor which is excited by the ultraviolet light or the short-wavelength visible light to emit visible light; and a second phosphor which is excited by the ultraviolet light or the short-wavelength visible light to emit visible light of a color different from that of the visible light emitted from the first phosphor, the light-emitting device being configured to emit light with a color temperature of from 2,800 K to 3,200 K by using light from each phosphor.

According to this embodiment, a light-emitting device which emits light with a relatively low color temperature with a power consumption lower than that of conventional incandescent lamps can be achieved.

The light-emitting device may also be configured to emit light so that an illuminance of 50 lx or more can be provided at a place 70 cm away from the device when a power of 1 W is supplied to the device. This enables high-efficiency lighting and is wide variety of applications.

Any combinations of the above components and any exchanges of expressions of the invention among method, device, system, and so forth are also valid as embodiments of the invention.

According to the invention, phosphors suitable for use in light-emitting devices for emitting warm light can be provided.

DETAILED DESCRIPTION OF THE INVENTION

Embodiments for carrying out the invention will be described in detail hereinbelow with reference to the drawings. In the description of the drawings, the same reference numerals are used to designate the same elements, and a repeated description will be omitted as appropriate.

Figure 1:
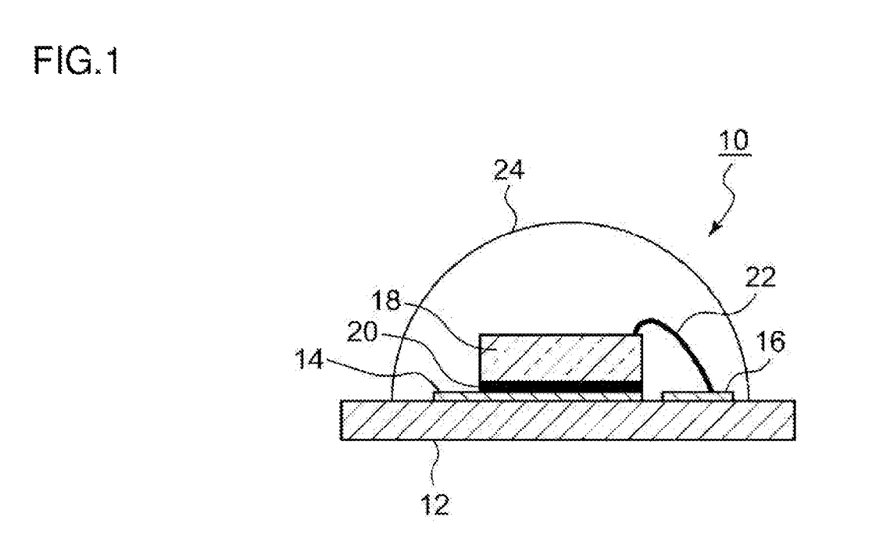
FIG. 1 is a schematic cross-sectional view showing a light-emitting device according to an embodiment of the invention.

FIG. 1 is a schematic cross-sectional view of a light-emitting device according to an embodiment of the invention. FIG. 1 shows a light-emitting device 10 having a substrate 12 and a pair of an electrode 14 (anode) and an electrode 16 (cathode), which are formed on the substrate 12. A semiconductor light-emitting element 18 is fixed on the electrode 14 with a mount member 20. The semiconductor light-emitting element 18 is electrically connected to the electrode 14 through the mount member 20, and the semiconductor light-emitting element 18 is also electrically connected to the electrode 16 through a wire 22. A dome-shaped phosphor layer 24 is formed on the semiconductor light-emitting element 18.

The substrate 12 is preferably made of a non-electrically-conductive material of high thermal conductivity, and examples that may be used include a ceramic substrate (such as an aluminum nitride substrate, an alumina substrate, a mullite substrate, or a glass ceramic substrate), a glass-epoxy substrate, and a metal substrate such as an aluminum or copper substrate.

The electrodes 14 and 16 are electrically-conductive layers made of a metal material such as gold or copper.

The semiconductor light-emitting element 18 is an example of the light-emitting element used in the light-emitting device of the invention, and for example, an LED, an LD, or any other element which emits ultraviolet light or short-wavelength visible light may be used. Examples are InGaN compound semiconductors. The emission wavelength region of InGaN compound semiconductors varies with In content. The emission wavelength tends to increase or decrease as the In content increases or decreases, and InGaN compound semiconductors whose In content is such that the peak wavelength is about 400 nm have been demonstrated to emit light with the highest quantum efficiency.

The mount member 20 is typically an electrically-conductive adhesive such as a silver paste or a gold-tin eutectic solder or the like, which is used to fix the lower surface of the semiconductor light-emitting element 18 to the electrode 14 and electrically connect the lower-side electrode of the semiconductor light-emitting element 18 to the electrode 14 on the substrate 12.

The wire 22 is an electrically-conductive component such as a gold wire, for example, which is bonded to the upper-side electrode of the semiconductor light-emitting element 18 and the electrode 16 by ultrasonic thermocompression bonding or the like so that they are electrically connected to each other.

The phosphor layer 24 includes each phosphor described below and a binder material with which each phosphor is sealed to form a hemisphere (dome) covering the upper surface of the semiconductor light-emitting element 18-carrying substrate 12. For example, the phosphor layer 24 is formed by a process including mixing phosphors into a binder material liquid or gel to form a phosphor paste, then applying the phosphor paste to the upper surface of the semiconductor light-emitting element 18 to form a hemispherical shape, and then curing the binder material of the phosphor paste. For example, the binder material to be used may be a silicone resin, a fluororesin, or the like. The binder material preferably has high ultraviolet-resistance performance, because an ultraviolet light or short-wavelength visible light source is used as an excitation light source in the light-emitting device according to an embodiment of the invention.

The phosphor layer 24 may also contain any of materials having various physical properties other than the phosphor. For example, a material having a refractive index higher than that of the binder material, such as a metal oxide, a fluorine compound, or a sulfide, may be added to the phosphor layer 24 to increase the refractive index of the phosphor layer 24. This is effective in reducing the total reflection, which is generated when the light emitted from the semiconductor light-emitting element 18 enters the phosphor layer 24, and in increasing the efficiency of entry of exciting light into the phosphor layer 24. In addition, the particle size of the additive material may be reduced to nano size, so that the refractive index can be increased without a decrease in the transparency of the phosphor layer 24. A white powder of alumina, zirconia, titanium oxide, or the like with an average particle size of about 0.3 to about 3 μm may also be added as a light scattering agent to the phosphor layer 24. This can prevent unevenness of brightness or chromaticity in the emission plane.

Next, a description is given of each phosphor used in the light-emitting device according to an embodiment of the invention.

(First Phosphor)

The first phosphor is a phosphor that is excited by ultraviolet or short-wavelength visible light to emit visible light and has the general formula $(M^2_x, M^3_y, M^4_z)_m M^1 O_3 X_{(2/n)}$, wherein M represents at least one element including at least Si and selected from the group consisting of Si, Ge, Ti, Zr, and Sn, $M^2$ represents at least one element including at least Ca and selected from the group consisting of Ca, Mg, Cd, Co, and Zn, $M^3$ represents at least one element including at least Sr and selected from the group consisting of Sr, Ra, Ba, and Pb, X represents at least one halogen element, $M^4$ represents at least one element including at least $Eu^{2+}$ and selected from the group consisting of rare-earth elements and Mn, m is in the range $1 \leq m \leq 4/3$, n is in the range $5 \leq n \leq 7$, and x, y, and z are each in such a range as to satisfy $x+y+z=1$, $0.45 \leq x \leq 0.8$, $0.05 \leq y \leq 0.45$, and $0.03 \leq z \leq 0.35$.

For example, the first phosphor can be obtained as described below. The first phosphor can be produced using the compounds represented by compositional formulae (1) to (4) below, respectively, as raw materials.

(1) $M'^1 O_2$ (wherein $M'^1$ represents a tetravalent element such as Si, Ge, Ti, Zr, or Sn)

(2) $M'^2 O$ (wherein $M'^2$ represents a bivalent element such as Mg, Ca, Sr, Ba, Cd, Co, or Zn)

(3) $M^{r3}X_2$ (wherein $M^{r3}$ represents a bivalent element such as Mg, Ca, Pb, Sr, Ba, or Ra, and X represents a halogen element)

(4) (wherein $M^{r4}$ represents a rare-earth element such as $Eu^{2+}$ and/or Mn).

For example, the raw material of compositional formula (1) may be $SiO_2$, $GeO_2$, $TiO_2$, $ZrO_2$, $SnO_2$, or the like. For example, the raw material of compositional formula (2) may be a carbonate, an oxide, a hydroxide, or the like of a bivalent metal ion. For example, the raw material of compositional formula (3) may be $SrCl_2$, $SrCl_2.6H_2O$, $MgCl_2$, $MgCl_2.6H_2O$, $CaCl_2$, $CaCl_2.2H_2O$, $BaCl_2$, $BaCl_2.2H_2O$, $ZnCl_2$, $MgF_2$, $CaF_2$, $SrF_2$, $BaF_2$, $ZnF_2$, $MgBr_2$, $CaBr_2$, $SrBr_2$, $BaBr_2$, $ZnBr_2$, $MgI_2$, $CaI_2$, $SrI_2$, $BaI_2$, $ZnI_2$, or the like. For example, the raw material of compositional formula (4) may be $Eu_2O_3$, $Eu_2(CO_3)_3$, $Eu(OH)_3$, $EuCl_3$, MnO, $Mn(OH)_2$, $MnCO_3$, $MnCl_2.4H_2O$, $Mn(NO_3)_2.6H_2O$, or the like.

In the raw material of compositional formula (1), $M^{r1}$ preferably includes at least Si. Si may also be partially substituted with at least one element selected from the group consisting of Ge, Ti, Zr, and Sn. In this case, the compound is preferably such that the content of Si in $M^{r1}$ is 80 mol % or more. In the raw material of compositional formula (2), $M^{r2}$ preferably includes at least Ca. Ca may also be partially substituted with at least one element selected from the group consisting of Mg, Sr, Ba, Zn, Cd, and Co. In this case, the compound is preferably such that the content of Ca in $M^{r2}$ is 60 mol % or more. In the raw material of compositional formula (3), $M^{r3}$ preferably includes at least Sr. Sr may also be partially substituted with at least one element selected from the group consisting of Mg, Ca, Ba, Ra, and Pb. In this case, the compound is preferably such that the content of Sr is 30 mol % or more. In the raw material of compositional formula (3), X preferably includes at least Cl. Cl may also be partially substituted with any other halogen element. In this case, the compound is preferably such that the content of Cl is 50 mol % or more. In the raw material of compositional formula (4), $M^{r4}$ is preferably a rare-earth element essentially including bivalent Eu, and $M^{r4}$ may also include Mn or a rare-earth element other than Eu.

The raw materials of compositional formulae (1) to (4) are weighed in the molar ratios (1):(2)=1:0.1-1.0, (2):(3)=1:0.2-12.0, and (2):(4)=1:0.05-4.0, preferably in the molar ratios (1):(2)=1:0.25-1.0, (2):(3)=1:0.3-6.0, and (2):(4)=1:0.05-3.0, more preferably in the molar ratios (1):(2)=1:0.25-1.0, (2):(3)=1:0.3-4.0, and (2):(4)=1:0.05-3.0. The weighed raw materials were each added to an alumina mortar and ground and mixed for about 30 minutes to form a raw material mixture. The raw material mixture was placed in an alumina crucible and baked in a reducing-atmosphere electric furnace under a specific atmosphere ($H_2:N_2$=5:95) at a temperature of from 700° C. to less than 1,100° C. for 3 to 40 hours so that a baked product is obtained. The baked product is thoroughly washed with warm pure water, so that the first phosphor is obtained by washing off the excess chloride. The first phosphor emits visible light when excited by ultraviolet light or short-wavelength visible light.

An excess amount of the raw material of compositional formula (3) (bivalent metal halide) is preferably weighed to exceed the stoichiometric ratio. In view of partial vaporization of the halogen element during the baking, this is to prevent crystal defects from being produced in the phosphor due to the shortage of the halogen element. The excessively added raw material of compositional formula (3) is liquefied at the baking temperature to serve as a flux for the solid-phase reaction, which accelerates the solid-phase reaction and improves crystallinity.

After the raw material mixture is baked, the excessively added raw material of compositional formula (3) remains as an impurity in the produced phosphor. Therefore, such an impurity is preferably washed off with warm pure water so that a phosphor with high purity and emission intensity can be obtained. The composition ratio indicated by the general formula of the first phosphor according to an embodiment of the invention is that obtained after the impurity is washed off, and therefore, the excessively added raw material of compositional formula (3), which produces an impurity, is not reflected in the composition ratio.

(Second Phosphor)

While the composition of the second phosphor is not restricted, the second phosphor is preferably a blue phosphor with a dominant emission wavelength in the range of 455 to 470 nm. When the blue is mixed with other colors to form an incandescent white color with a color temperature of 3,200 K or less, more preferably 3,150 K or less, it is suitable to use the first phosphor which emits light with a dominant wavelength of 577.5 nm or more. Examples of the second phosphor include the compounds represented by the compositional formulae below.

$(Ca,M)_5(PO_4)_3X$:Eu (wherein M represents a bivalent alkaline-earth metal, and X represents a halogen element)

$Sr_5(PO_4)_3X$:Eu (wherein X represents a halogen element)

$BaMgAl_{10}O_{17}$:Eu.

For example, the second phosphor can be obtained as described below. $CaCO_3$, $MgCO_3$, $CaCl_2$, $CaHPO_4$, and $Eu_2O_3$ are used as raw materials for the second phosphor. These raw materials are weighed in a specific ratio so that the molar ratio $CaCO_3:MgCO_3:CaCl_2:CaHPO_4:Eu_2O_3$=0.05-0.35:0.01-0.50:0.17-0.50:1.00:0.005-0.050 can be achieved. The weighed raw materials were each added to an alumina mortar and ground and mixed for about 30 minutes to form a raw material mixture. The raw material mixture was placed in an alumina crucible and baked in an $N_2$ atmosphere containing 2 to 5% of $H_2$ at a temperature of from 800° C. to less than 1,200° C. for 3 hours so that a baked product is obtained. The baked product is thoroughly washed with warm pure water, so that the second phosphor is obtained by washing off the excess chloride. The second phosphor emits visible light with a color complementary to that of the visible light emitted by the first phosphor.

In the process of obtaining the raw material mixture, an excess amount of $CaCl_2$ is preferably weighed (in molar ratio), which is at least 0.5 moles more than that in the stoichiometric ratio with respect to the composition ratio of the second phosphor to be produced. This can prevent crystal defects from being produced in the second phosphor due to the shortage of Cl.

<Identification of the Crystal Structure of Phosphors>

Next, a description is given of how to determine the crystal structure and other properties of the phosphors according to an embodiment of the invention. While a certain material is described as an example below, the crystal structure and other properties of each phosphor described later can also be determined by the same method.

First, a single host crystal was grown as described below. The host crystal is a material of the general formula $M^1O_2.a(M^2_{1-z}.M^4_z)O.bM^3X_2$, where $M^1$=Si, $M^2$=Ca and Sr, $M^3$=Sr, X=Cl, and $M^4$ is absent.

<Production and Analysis of Host Crystal>

The single host crystal was grown by the procedure described below. First, the raw materials $SiO_2$, CaO, and $SrCl_2$ were each weighed in the molar ratio $SiO_2:CaO:SrCl_2$=1:0.71:1.07. The weighed materials were each placed in an alumina mortar and ground and mixed for about 30 minutes so that a raw material mixture was obtained. The raw material mixture was packed into a tablet die and subjected to uniaxial compression molding at 100 MPa so that a compact was obtained. The compact was placed in an alumina crucible. After the crucible was covered with a lid, the compact was baked in the air at 1,030° C. for 36 hours, so that a baked product was obtained. The resulting baked product was ultrasonically washed with warm pure water, so that a host crystal was obtained. A Φ0.2 mm single crystal was obtained from the resulting host crystal.

The resulting host crystal was subjected to quantitative elemental analysis by the method described below so that its composition ratio (the a and b values in the general formula) was determined.

(1) Quantitative Analysis of Si

The host crystal was melted with sodium carbonate in a platinum crucible, and then the melt was dissolved with dilute nitric acid so that a constant volume of solution was obtained. The solution was measured for Si content using an ICP emission spectrophotometer (SPS-4000, manufactured by SII Nano Technology Inc.).

(2) Quantitative Analysis of Metal Elements

The host crystal was thermally decomposed with perchloric acid, nitric acid, and hydrofluoric acid under inert gas, and dissolved with dilute nitric acid so that a constant volume of solution was obtained. The solution was measured for metal element content using the ICP emission spectrophotometer.

(3) Quantitative Analysis of Cl

The host crystal was burnt in a tubular electric furnace, and the generated gas was adsorbed to an adsorbing liquid. The resulting solution was determined for Cl content by ion chromatography using DX-500 manufactured by Dionex Corporation.

(4) Quantitative Analysis of O

Using a nitrogen/oxygen analyzer TC-436 manufactured by LECO Corporation, a sample of the host crystal was thermally decomposed in argon, and the generated oxygen was quantified by infrared absorption method.

As a result of the quantitative elemental analysis described above, the resulting host crystal was found to approximately have the composition ratio according to formula (1) below.

$$SiO_2 \cdot 1.05(Ca_{0.6}, Sr_{0.4})O \cdot 0.15 SrCl_2 \qquad \text{formula (1)}$$

Using a pycnometer, the specific gravity of the host crystal was determined to be 3.4.

The single crystal of the host crystal was measured for X-ray diffraction pattern by an automatic X-ray imaging plate single crystal structure analyzer (R-AXIS RAPID, manufactured by Rigaku Corporation) using Mo Kα radiation (wavelength λ=0.71 Å) thereinafter referred to as "measurement 1").

The crystal structure analysis was performed as described below using 5,709 diffraction spots obtained, in the range 2θ<60° (d>0.71 Å) by measurement 1.

The crystal system, Bravais lattice, space group, and lattice constant of the host crystal were determined, as shown below, from the X-ray diffraction pattern obtained by measurement 1, using data processing software (Rapid Auto, manufactured by Rigaku Corporation).

Crystal system: monocline
Bravais lattice: base-centered monoclinic lattice.
Space group: C2/m
Lattice constant:
a=13.3036(12) Å
b=8.3067(8) Å
c=9.1567(12) Å
α=γ=90°
β=110.226(5)°
V=949.50(18) Å³

Subsequently, an approximate structure, was determined by direct method using crystal structure, analysis software (Crystal Structure, manufactured by Rigaku Corporation), and then the structural parameters (such as site occupancy, atomic coordinate, and temperature factor) were refined by least squares method. The refinement was performed on 1,160 independent |F| values satisfying |F|>2σF. As a result, a crystal structure model was obtained with a reliability factor $R_1$ of 2.7%. Hereinafter, this crystal structure model is referred to as the "initial structure model."

Table 1 shows the atomic coordinate and the occupancy of the initial structure model obtained from the single crystal.

TABLE 1

| ELEMENT | SITE | x | y | z | OCCUPANCY |
|---|---|---|---|---|---|
| Ca1 | 2c | 0.0000 | 0.0000 | 0.5000 | 1 |
| Sr2 | 4i | 0.28471(5) | 0.5000 | 0.07924(6) | 1 |
| Sr3 | 8j | 0.09438(5) | 0.74970(8) | 0.24771(6) | 0.427(5) |
| Ca3 | 8j | 0.09438(5) | 0.74970(8) | 0.24771(6) | 0.573(5) |
| Cl1 | 2b | 0.0000 | 0.5000 | 0.0000 | 1 |
| Cl2 | 2a | 0.0000 | 0.0000 | 0.0000 | 1 |
| Si1 | 4i | 0.2323(1) | 0.5000 | 0.4989(2) | 1 |
| Si2 | 8j | −0.15109(9) | 0.6746(1) | 0.2854(1) | 1 |
| O1 | 4i | −0.0985(3) | 0.5000 | 0.2645(5) | 1 |
| O2 | 4i | 0.1987(3) | 0.5000 | 0.3145(4) | 1 |
| O3 | 4i | 0.3575(3) | 0.5000 | 0.6019(5) | 1 |
| O4 | 8j | 0.1734(2) | 0.3423(3) | 0.5469(3) | 1 |
| O5 | 8j | −0.2635(2) | 0.7007(3) | 0.1478(3) | 1 |
| O6 | 8j | −0.0677(2) | 0.8154(4) | 0.2941(3) | 1 |

The initial structure model obtained from the single crystal was calculated to have the composition ratio according to formula (2) below.

$$SiO_2 \cdot 1.0(Ca_{0.6}, Sr_{0.4})O \cdot 0.17 SrCl_2 \qquad \text{formula (2)}$$

According to the general formula of the above phosphor, the metal ion (bivalent), the tetravalent oxide ion, and the halogen ion are rearranged to form such a new general formula as $(M^2_x, M^3_y, M^4_z)_m M^1 O_3 X_{(2/n)}$. As a result, formula (3) below is obtained.

$$(Ca_{0.51}, Sr_{0.49})_{7/6} SiO_3 Cl_{2/6} \qquad \text{formula (3)}$$

As a result of the analysis, the host crystal described above was found to have a new crystal structure not registered in ICDD (International Center for Diffraction Data), which is a database widely used for X-ray diffraction. The analysis method described above was also applied to each phosphor described below.

EXAMPLES

The above phosphor and the above light-emitting device are more specifically described below using examples. It will be understood that the raw materials for the phosphor and the light-emitting device, the production method, the chemical composition of the phosphor, and other features described below are not intended to limit embodiments of the phosphor and the light-emitting device according to the invention.

First, phosphors used in the light-emitting devices of the examples are described in detail.

Phosphor 1

Phosphor 1 is a phosphor represented by $(Ca_{0.6}, Sr_{0.25}, Eu_{0.15})_{7/6} SiO_3 Cl_{2/6}$. Phosphor 1 is so synthesized as to have the general formula $(M^2_x,M^3_y,M^4_z)_m M^1 O_3 X_{(2/n)}$, wherein $M^1$=Si, $M^2$=Ca, $M^3$=Sr, X=Cl, $M^4$=Eu$^{2+}$, m=7/6, n=6, the contents x, y, and z of $M^2$, $M^3$, and $M^4$ are 0.60, 0.25, and 0.15, respectively. In phosphor 1, cristobalite is produced, because $SiO_2$ is added as a raw material in an excess mixing ratio. Phosphor 1 was produced as described below. First, the raw materials $SiO_2$, $Ca(OH)_2$, $SrCl_2.6H_2O$, and $Eu_2O_3$ were each weighed so that the molar ratio of them was $SiO_2:Ca(OH)_2:SrCl_2.6H_2O:Eu_2O_3$=1.0:0.37:0.40:0.07, and the weighed raw materials were each added to an alumina mortar and ground and mixed for about 30 minutes, so that a raw material mixture was obtained. The raw material mixture was placed in an alumina crucible and baked under a specific reducing atmosphere ($H_2:N_2$=5:95) at a temperature of 1,030° C. for 5 to 40 hours in an electric furnace, so that a baked product was obtained. The resulting baked product was thoroughly washed with warm pure water, so that phosphor 1 was obtained.

Phosphor 2

Phosphor 2 is a phosphor represented by $(Ca_{0.61},Sr_{0.23},Eu_{0.16})_{7/6}SiO_3Cl_{2/6}$. Phosphor 2 is so synthesized as to have the general formula $(M^2_x,M^3_y,M^4_z)_m M^1 O_3 X_{2/n}$, wherein $M^1$=Si, $M^2$=Ca, $M^3$=Sr, X=Cl, $M^4$=Eu$^{2+}$, m=7/6, n=6, and the contents x, y, and z of $M^2$, $M^3$, and $M^4$ are 0.61, 0.23, and 0.16, respectively. In phosphor 2, cristobalite is also produced, because $SiO_2$ is added as a raw material in an excess mixing ratio more than that for the other phosphors of the examples. Phosphor 2 was produced as described below. First, the raw materials $SiO_2$, $Ca(OH)_2$, $SrCl_2.6H_2O$, and $Eu_2O_3$ were each weighed so that the molar ratio of them was $SiO_2:Ca(OH)_2:SrCl_2.6H_2O:Eu_2O_3$=1.0:0.16:0.18:0.03. Subsequently, the same process as for phosphor 1 was performed so that phosphor 2 was obtained.

Phosphor 3

Phosphor 3 is a phosphor represented by $(Ca_{0.62},Sr_{0.22},Eu_{0.16})_{7/6}SiO_3Cl_{2/6}$. Phosphor 3 is so synthesized as to have the general formula $(M^2_x,M^3_y,M^4_z)_m M^1 O_3 X_{2/n}$, where $M^1$=Si, $M^2$=Ca, $M^3$=Sr, X=Cl, $M^4$=Eu$^{2+}$, m=7/6, n=6, and the context x, y, and z of $M^2$, $M^3$, and $M^4$ are 0.62, 0.22, and 0.16, respectively. In the production of phosphor 3, Ca was added more than Sr in terms of raw material molar ratio. In phosphor 3, cristobalite is also produced, because $SiO_2$ is added as a raw material in an excess mixing ratio. Phosphor 3 was produced as described below. First, the raw materials $SiO_2$, $Ca(OH)_2$, $SrCl_2.6H_2O$, and $Eu_2O_3$ were each weighed so that the molar ratio of them was $SiO_2:Ca(OH)_2:SrCl_2.6H_2O:Eu_2O_3$=1.0:0.54:0.42:0.08. Subsequently, the same process as for phosphor 1 was performed so that phosphor 3 was obtained.

Phosphor 4

Phosphor 4 is a phosphor represented by $(Ca_{0.61},Sr_{0.21},Eu_{0.18})_{7/6}SiO_3Cl_{2/6}$. Phosphor 4 is so synthesized as to have the general formula wherein $M^1$=Si, $M^2$=Ca, $M^3$=Sr, X=Cl, $M^4$=Eu$^{2+}$, m=7/6, n=6, and the contents x, y, and z of $M^2$, $M^3$, and $M^4$ are 0.61, 0.21, and 0.18, respectively. In the production of phosphor 4, Ca was added more than Sr in terms of raw material molar ratio, and Eu in the raw materials was increased by 1.5 times more than usual, in phosphor 4, cristobalite is also produced, because $SiO_2$ is added as a raw material in an excess mixing ratio. Phosphor 4 was produced as described below. First, the raw materials $SiO_2$, $Ca(OH)_2$, $SrCl_2.6H_2O$, and $Eu_2O_3$ were each weighed so that the molar ratio of them was $SiO_2:Ca(OH)_2:SrCl_2.6H_2O:Eu_2O_3$=1.0:0.50:0.45:0.14. Subsequently, the same process as for phosphor 1 was performed so that phosphor 4 was obtained.

Phosphor 5

Phosphor 5 is a phosphor represented by $(Ca_{0.58},Sr_{0.22},Ba_{0.05},Eu_{0.15})_{7/6}SiO_3Cl_{2/6}$. Phosphor 5 is so synthesized as to have the general formula $(M^2_x,M^3_y,M^4_z)_m M^1 O_3 X_{2/n}$, where $M^1$=Si, $M^2$=Ca, $M^3$=Sr and Ba, X=Cl, $M^4$=Eu$^{2+}$, m=7/6, n=6, and the contents x, y, and z of $M^2$, $M^3$, and $M^4$ are 0.58, 0.27, and 0.15, respectively. In phosphor 5, cristobalite is also produced, because $SiO_2$ is added as a raw material in an excess mixing ratio. Phosphor 5 was produced as described below. First, the raw materials $SiO_2$, $Ca(OH)_2$, $SrCl_2.6H_2O$, $BaCO_3$, and $Eu_2O_3$ were each weighed so that the molar ratio of them was $SiO_2:Ca(OH)_2:SrCl_2.6H_2O:BaCO_3:Eu_2O_3$=1.0:0.50:0.45:0.05:0.09. Subsequently, the same process as for phosphor 1 was performed so that phosphor 5 was obtained.

Comparative Example

Phosphor 6

Phosphor 6 is a phosphor represented by $(Ca_{0.47},Sr_{0.48},Eu_{0.05})_{7/6}SiO_3Cl_{2/6}$. Phosphor 6 is so synthesized as to have the general formula $(M^2_x,M^3_y,M^4_z)_m M^1 O_3 X_{2/n}$, where $M^1$=Si, $M^2$=Ca, $M^3$=Sr, X=Cl, $M^4$=Eu$^{2+}$, m=7/6, n=6, and the contents x, y, and z of $M^2$, $M^3$, and $M^4$ are 0.47, 0.48, and 0.05, respectively. In phosphor 6, cristobalite is also produced, because $SiO_2$ is added as a raw material in an excess mixing ratio. Phosphor 6 was produced as described below. First, the raw materials $SiO_2$, $Ca(OH)_2$, $SrCl_2.6H_2O$, and $Eu_2O_3$ were each weighed so that the molar ratio of them was $SiO_2:Ca(OH)_2:SrCl_2.6H_2O:Eu_2O_3$=1.1:0.45:1.0:0.13. Subsequently, the same process as for phosphor 1 was performed so that phosphor 6 was obtained.

Other Examples

Hereinafter, Examples 7 to 12 are described, which are other examples for trial production of cristobalite-free single-phase phosphors.

Phosphor 7

Phosphor 7 is a phosphor represented by $(Ca_{0.63},Sr_{0.33},Eu_{0.04})_{7/6}SiO_3Cl_{2/6}$. Phosphor 7 is so synthesized as to have the general formula $(M^2_x,M^3_y,M^4_z)_m M^1 O_3 X_{2/n}$, wherein $M^1$=Si, $M^2$=Ca, $M^3$=Sr, X=Cl, $M^4$=Eu$^{2+}$, m=7/6, n=6, and the contents x, y, and z of $M^2$, $M^3$, and $M^4$ are 0.63, 0.33, and 0.04, respectively. Phosphor 7 was produced as described below. First, the raw materials $SiO_2$, $Ca(OH)_2$, $SrCl_2.6H_2O$, and $Eu_2O_3$ were each weighed so that the molar ratio of them was $SiO_2:Ca(OH)_2:SrCl_2.6H_2O:Eu_2O_3$=1:0.61:0.57:0.02. Subsequently, the same process as for phosphor 1 was performed so that phosphor 6 was obtained.

Phosphor 8

Phosphor 8 is a phosphor represented by $(Ca_{0.58},Sr_{0.12},Eu_{0.30})_{7/6}SiO_3Cl_{2/6}$. Phosphor 8 is so synthesized as to have the general formula wherein $M^1$=Si, $M^2$=Ca, $M^3$=Sr, X=Cl, $M^4$=Eu$^{2+}$, m=7/6, n=6, and the contents x, y, and z of $M^2$, $M^3$, and $M^4$ are 0.58, 0.12, and 0.30, respectively. Phosphor 8 was produced as described below. First, the raw materials $SiO_2$, Ca(OH)$_2$, SrCl$_2$·6H$_2$O, and Eu$_2$O$_3$ were each weighed so that the molar ratio of them was SiO$_2$:Ca(OH)$_2$:SrCl$_2$·6H$_2$O: Eu$_2$O$_3$=1:0.41:0.36:0.23. Subsequently, the same process as for phosphor 1 was performed so that phosphor 8 was obtained.

Phosphor 9

Phosphor 9 is a phosphor represented by (Ca$_{0.48}$,Sr$_{0.40}$, Eu$_{0.12}$)$_{7/6}$SiO$_3$Cl$_{2/6}$. Phosphor 9 is so synthesized as to have the general formula (M$^2_x$,M$^3_y$,M$^4_z$)$_m$M$^1$O$_3$X$_{2/n}$, wherein M$^1$=Si, M$^2$=Ca, M$^3$=Sr, X=Cl, M$^4$=Eu$^{2+}$, m=7/6, n=6, and the contents x, y, and z of M$^2$, M$^3$, and M$^4$ are 0.48, 0.40, and 0.12, respectively. Phosphor 9 was produced as described below. First, the raw materials SiO$_2$, Ca(OH)$_2$, SrCl$_2$·6H$_2$O, and Eu$_2$O$_3$ were each weighed so that the molar ratio of them was SiO$_2$:Ca(OH)$_2$:SrCl$_2$·6H$_2$O:Eu$_2$O$_3$=1:0.18:0.18:0.03. Subsequently, the same process as for phosphor 1 was performed so that phosphor 9 was obtained.

Phosphor 10

Phosphor 10 is a phosphor represented by (Ca$_{0.60}$,Sr$_{0.30}$, Eu$_{0.10}$)$_{7/6}$SiO$_3$Cl$_{2/6}$. Phosphor 10 is so synthesized as to have the general formula (M$^2_x$,M$^3_y$,M$^4_z$)$_m$M$^1$O$_3$X$_{2/n}$, wherein M$^1$=Si, M$^2$=Ca, M$^3$=Sr, X=Cl, M$^4$=Eu$^{2+}$, m=7/6, n=6, and the contents x, y, and z of M$^2$, M$^3$ and M$^4$ are 0.60, 0.30, and 0.10, respectively. Phosphor 10 was produced as described below. First, the raw materials SiO$_2$, Ca(OH)$_2$, SrCl$_2$·6H$_2$O, and Eu$_2$O$_3$ were each weighed so that the molar ratio of them was SiO$_2$:Ca(OH)$_2$:SrCl$_2$·6H$_2$O:Eu$_2$O$_3$=1:0.22:0.14:0.03. Subsequently, the same process as for phosphor 1 was performed so that phosphor 10 was obtained.

Phosphor 11

Phosphor 11 is a phosphor represented by (Ca$_{0.65}$,Sr$_{0.27}$, Eu$_{0.08}$)$_{7/6}$SiO$_3$Cl$_{2/6}$. Phosphor 11 is so synthesized as to have the general formula (M$^2_x$,M$^3_y$,M$^4_z$)$_m$M$^1$O$_3$X$_{2/n}$, wherein M$^1$=Si, M$^2$=Ca, M$^3$=Sr, X=Cl, M$^4$=Eu$^{2+}$, m=7/6, n=6, and the contents x, y, and z of M$^2$, M$^3$, and M$^4$ are 0.65, 0.27, and 0.08, respectively. Phosphor 11 was produced as described below. First, the raw materials SiO$_2$, Ca(OH)$_2$, SrCl$_2$·6H$_2$O, and Eu$_2$O$_3$ were each weighed so that the molar ratio of them was SiO$_2$:Ca(OH)$_2$:SrCl$_2$·6H$_2$O:Eu$_2$O$_3$=1:0.22:0.13:0.03. Subsequently, the same process as for phosphor 1 was performed so that phosphor 11 was obtained.

Phosphor 12

Phosphor 12 is a phosphor represented by (Ca$_{0.71}$,Sr$_{0.22}$, Eu$_{0.07}$)$_{7/6}$SiO$_3$Cl$_{2/6}$. Phosphor 12 is so synthesized as to have the general formula (M$^2_x$,M$^3_y$,M$^4_z$)$_m$M$^1$O$_3$X$_{2/n}$, wherein M$^1$=Si, M$^2$=Ca, M$^3$=Sr, X=Cl, M$^4$=Eu$^{2+}$, m=7/6, n=6, and the contents x, y, and z of M$^2$, M$^3$, and M$^4$ are 0.71, 0.22, and 0.07, respectively. Phosphor 12 was produced as described below. First, the raw materials SiO$_2$, Ca(OH)$_2$, SrCl$_2$·6H$_2$O, and Eu$_2$O$_3$ were each weighed, so that the molar ratio of them was SiO$_2$:Ca(OH)$_2$:SrCl$_2$·6H$_2$O:Eu$_2$O$_3$=1:0.24:0.12:0.03. Subsequently, the same process as for phosphor 1 was performed so that phosphor 12 was obtained.

Figure 2:
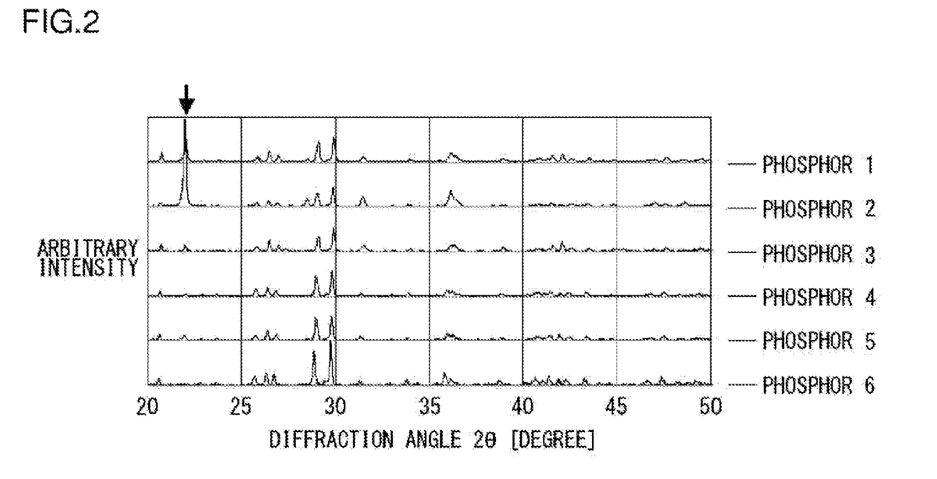
FIG. 2 is a chart showing the results of X-ray diffraction measurement using Cu Kα characteristic X-ray with respect to phosphors 1 to 6 according to the examples.
Figure 3:
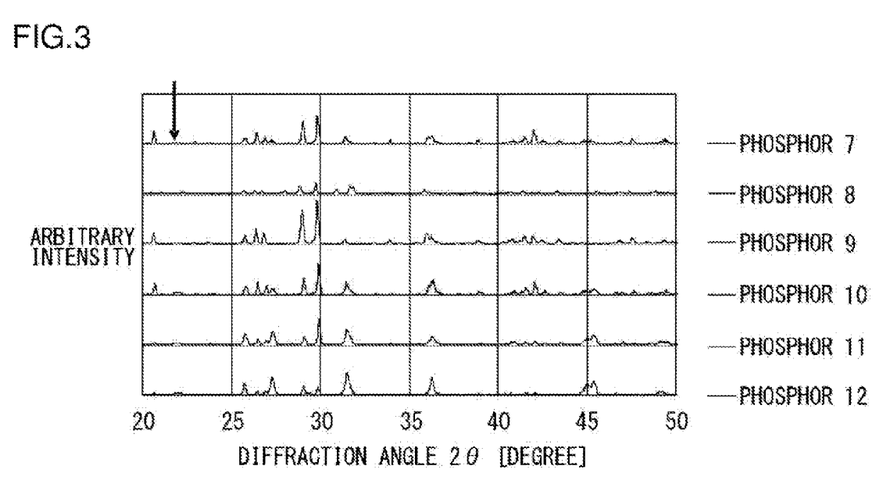
FIG. 3 is a chart showing the results of X-ray diffraction measurement using Cu Kα characteristic X-ray with respect to phosphors 7 to 12 according to the examples.

Subsequently, each phosphor, in which the host crystal described above was doped with Eu as an emission center element, was subjected to crystal X-ray diffractometry. First, powder X-ray diffractometry was performed using a powder X-ray diffractometer (RINT Ultima III, manufactured by Rigaku Corporation) and Cu Kα characteristic X-ray (hereinafter referred to as measurement 2). The diffraction patterns observed, in measurement 2 are shown in FIGS. 2 and 3. FIG. 2 is a chart showing the results of the X-ray diffraction measurement of phosphors 1 to 6 of the examples using Cu Kα characteristic X-ray. FIG. 3 is a chart showing the results of the X-ray diffraction measurement of phosphors 7 to 12 of the examples using Cu Kα characteristic X-ray. It is apparent from FIGS. 2 and 3 that phosphors 1 to 12 have X-ray diffraction patterns in very good agreement with one another and therefore have the same crystal structure. Concerning phosphor 2, however, a strong diffraction peak of cristobalite was observed at the site indicated by the arrow in FIG. 2, because SiO$_2$ was added in an excess amount more than that for each of the other phosphors of the examples before baked.

It is also apparent from FIG. 3 that phosphors 7 to 12 (six samples in total), in which no peak was observed at near 22 degrees as indicated by the arrow, are area cristobalite-free single phase.

Figure 4:
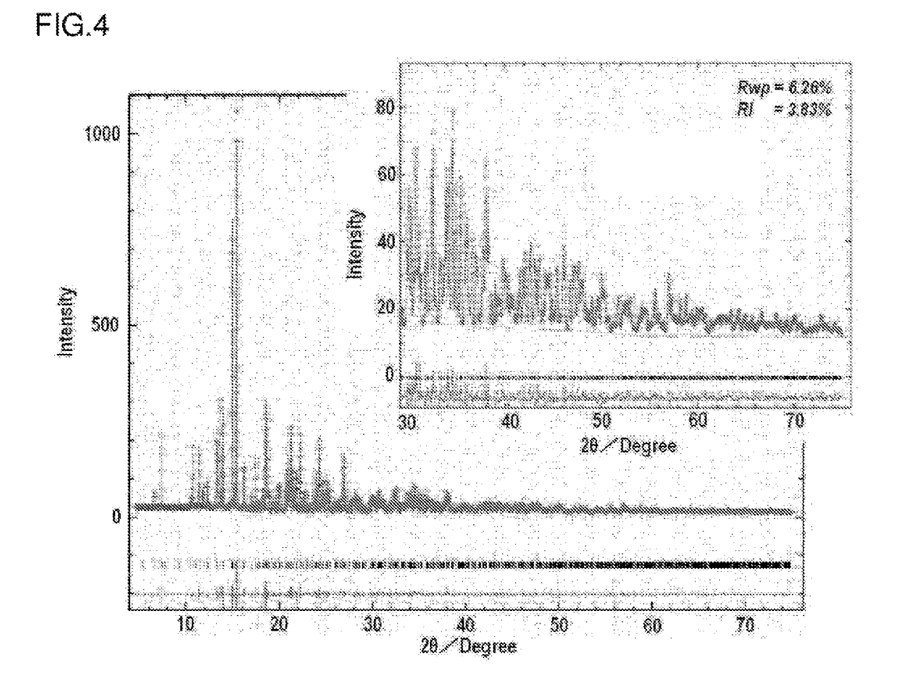
FIG. 4 is a chart showing the result of Rietveld analysis of phosphor 1 according to the examples.

To determine a more detailed crystal structure, the powdery phosphor sample was used as a host crystal powder and subjected to precise X-ray diffractometry (hereinafter referred to as measurement 3) using 0.8022 Å wavelength X-ray and the BL02B2 large Debye-Scherrer camera of Super Photon ring-8 GeV (SPring-8) in JAPAN SYNCHROTRON RADIATION RESEARCH INSTITUTE (JASRI). The diffraction pattern observed in measurement 3 was subjected to Rietveld analysis, in which the phosphor composition and the lattice constant were determined. When the Rietveld analysis was performed, refinement was performed using the lattice constant, atomic coordinate, and space group of the initial structure model described above. FIG. 4 is a chart showing the result of the Rietveld analysis of phosphor 1 according to the examples. As a result, the diffraction pattern observed in measurement 3 is in good agreement with the calculated diffraction pattern fit by the Rietveld analysis, and the R factor indicating the reliability of the Rietveld analysis was good (R$_{WP}$=6.25% (d>0.66 Å)).

Table 2 shows the composition ratios of phosphors 1 to 6, which were calculated by the Rietveld analysis. Table 3 also shows the composition ratios of phosphors 7 to 12. The compositions of phosphors 7 to 12 were analyzed using a fluorescent X-ray analyzer.

TABLE 2

| | M1 | M2 | M3 | | M4 | X | | |
|---|---|---|---|---|---|---|---|---|
| | Si | Ca | Sr | Ba | Eu$^{2+}$ | Cl | m | n |
| PHOSPHOR 1 | 1 | 0.60 | 0.25 | | 0.15 | 1 | 7/6 | 6 |
| PHOSPHOR 2 | 1 | 0.61 | 0.23 | | 0.16 | 1 | 7/6 | 6 |
| PHOSPHOR 3 | 1 | 0.62 | 0.22 | | 0.16 | 1 | 7/6 | 6 |
| PHOSPHOR 4 | 1 | 0.61 | 0.21 | | 0.18 | 1 | 7/6 | 6 |
| PHOSPHOR 5 | 1 | 0.58 | 0.22 | 0.05 | 0.15 | 1 | 7/6 | 6 |
| PHOSPHOR 6 | 1 | 0.47 | 0.48 | | 0.05 | 1 | 7/6 | 6 |

TABLE 3

| | M1 | M2 | M3 | | M4 | X | | |
|---|---|---|---|---|---|---|---|---|
| | Si | Ca | Sr | Ba | Eu$^{2+}$ | Cl | m | n |
| PHOSPHOR 7 | 1 | 0.63 | 0.33 | | 0.04 | 1 | 7/6 | 6 |
| PHOSPHOR 8 | 1 | 0.58 | 0.12 | | 0.30 | 1 | 7/6 | 6 |
| PHOSPHOR 9 | 1 | 0.48 | 0.40 | | 0.12 | 1 | 7/6 | 6 |
| PHOSPHOR 10 | 1 | 0.60 | 0.31 | | 0.10 | 1 | 7/6 | 6 |
| PHOSPHOR 11 | 1 | 0.65 | 0.27 | | 0.08 | 1 | 7/6 | 6 |
| PHOSPHOR 12 | 1 | 0.71 | 0.22 | | 0.07 | 1 | 7/6 | 6 |

Next, Table 4 shows the lattice constants and $R_{WP}$ (d>066 Å) values of phosphors 1 to 6, which were calculated by the Rietveld analysis.

TABLE 4

|  | a | b | c | β | V | Rwp (%) |
|---|---|---|---|---|---|---|
| PHOSPHOR 1 | 13.246 | 8.321 | 9.152 | 110.210 | 946.61 | 6.26 |
| PHOSPHOR 2 | 13.251 | 8.323 | 9.154 | 110.209 | 947.48 | 7.37 |
| PHOSPHOR 3 | 13.239 | 8.318 | 9.151 | 110.216 | 945.67 | 5.78 |
| PHOSPHOR 4 | 13.243 | 8.320 | 9.152 | 110.210 | 946.36 | 7.08 |
| PHOSPHOR 5 | 13.268 | 8.333 | 9.169 | 110.220 | 951.25 | 5.83 |
| PHOSPHOR 6 | 13.345 | 8.359 | 9.188 | 110.193 | 961.92 | 5.28 |

As shown in Table 4, all the RWP (d>0.66 Å) values are good, which means that the reliability of the analysis result is high. It is also apparent that the calculated lattice constants of phosphors 1 to 5 of the examples are each smaller than that of phosphor 6 of the comparative example. This is also apparent from the fact that the diffraction patterns of phosphors 1 to 5 shown in FIGS. 2 and 3 are shifted to the high angle side relative to the diffraction pattern of phosphor 6.

Next, Table 5 shows the emission dominant wavelengths and the emission intensity ratios (luminous flux ratios) of phosphors 1 to 12. The emission intensity ratio is indicated by the ratio obtained, when the emission intensity of phosphor 6 measured under the application of 400 nm exciting light is normalized as 100.

TABLE 5

|  |  | EMISSION DOMINANT WAVELENTH (nm) | LUMINOUS FLUX RATIO | x | z | y |
|---|---|---|---|---|---|---|
| EXAMPLES | PHOSPHOR 1 | 578.2 | 97 | 0.60 | 0.15 | 0.25 |
|  | PHOSPHOR 2 | 577.6 | 90 | 0.61 | 0.16 | 0.23 |
|  | PHOSPHOR 3 | 578.3 | 90 | 0.62 | 0.16 | 0.22 |
|  | PHOSPHOR 4 | 578.4 | 103 | 0.61 | 0.18 | 0.21 |
|  | PHOSPHOR 5 | 578.2 | 99 | 0.58 | 0.15 | 0.27 |
| COMPARATIVE EXAMPLE | PHOSPHOR 6 | 575.5 | 100 | 0.47 | 0.05 | 0.48 |
| EXAMPLES | PHOSPHOR 7 | 578.0 | 51 | 0.63 | 0.04 | 0.33 |
|  | PHOSPHOR 8 | 579.6 | 40 | 0.58 | 0.30 | 0.12 |
|  | PHOSPHOR 9 | 577.6 | 97 | 0.48 | 0.12 | 0.40 |
|  | PHOSPHOR 10 | 578.9 | 64 | 0.60 | 0.10 | 0.31 |
|  | PHOSPHOR 11 | 578.7 | 34 | 0.65 | 0.08 | 0.27 |
|  | PHOSPHOR 12 | 579.2 | 13 | 0.71 | 0.07 | 0.22 |

In summary, phosphors 1 to 5 and 7 to 11 of the examples are yellow phosphors that emit light with a long dominant wavelength of at least 577.6 nm. Even though emitting long-wavelength light, phosphors 1 to 5 and 7 to 11 also exhibit high emission intensities, which are from 34 to 103% of that of phosphor to with a dominant wavelength of 575.5 nm. On the other hand, the emission intensity of phosphor 12 is as low as 13% of that of phosphor 6.

Phosphors 1 to 5 and 7 to 11 of the examples each have the general formula $(M^2{}_x,M^3{}_y,M^4{}_z)_m M^1 O_3 X_{2/n}$ in which x (the Ca element ratio obtained, when the sum of the metal element ratios is normalized as 1) is in the range of from 0.45 to 0.8, and their dominant wavelength tends to increase as the x value increases. More preferably, the x value is in the range of from 0.48 to 0.65.

Phosphors 1 to 5 and 7 to 11 of the examples each have the general formula $(M^2{}_x,M^3{}_y,M^4{}_z)_m M^1 O_3 X_{2/n}$ in which z (the Eu element ratio obtained when the sum of the metal element ratios is normalized as 1) is in the range of from 0.03 to 0.35. In particular, phosphor 4 with a relatively high z value showed the highest emission intensity, even though the dominant wavelength was long. More preferably, the z value is in the range of from 0.04 to 0.30.

Phosphors 1 to 5 and 7 to 11 of the examples each have the general formula $(M^2{}_x,M^3{}_y,M^4{}_z)_m M^1 O_3 X_{2/n}$ in which y (the Sr+Ba element ratio obtained when the sum of the metal element ratios is normalized as 1) is in the range of from 0.05 to 0.45. More preferably, the y value is in the range of from 0.12 to 0.40.

Figure 5:
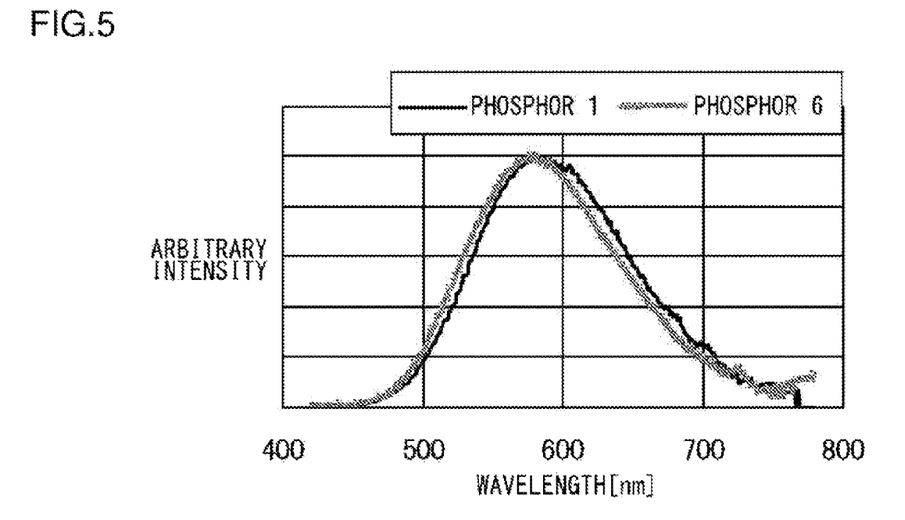
FIG. 5 is a chart showing the emission spectra of phosphors 1 and 6.
Figure 6:
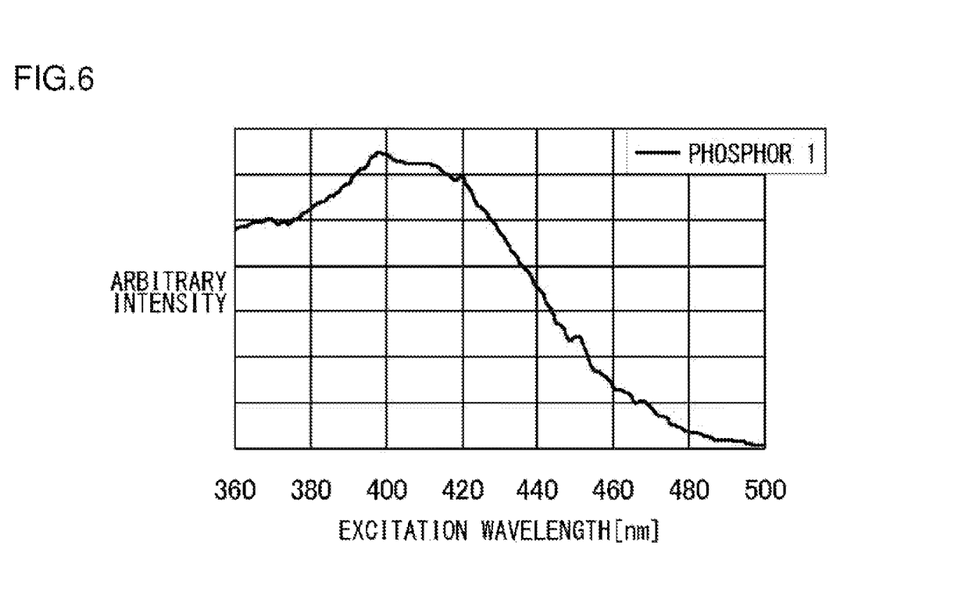
FIG. 6 is a chart showing the excitation spectrum of phosphor 1.

FIG. 5 is a chart showing the emission spectra of phosphors 1 and 6. FIG. 6 is a chart showing the excitation spectrum of phosphor 1. It is apparent from FIGS. 5 and 6 that the phosphors according to embodiments of the invention are more effectively excited by near-ultraviolet light and short-wavelength visible light, and emit yellow light on the long-wavelength side upon application of exciting light.

As shown above, the peak wavelength of the spectrum of each phosphor in which the elements with a relatively small ionic radius (Ca, Mg, Zn, Cd, Co) have a high content is shifted to the long-wavelength side relative to that of phosphor 6 (Comparative Example). Therefore, the phosphors of the examples are suitable for use in light-emitting devices for emitting warm light with relatively low color temperature.

Next, a detailed description is given of the structure of a light-emitting device according to an example.

<Structure of Light-Emitting Device>

The light-emitting device according to an example has the specific structure described below according to the light-emitting device shown in FIG. 1. The light-emitting device structure described below is the same in the example and the comparative example, except for the type of the phosphor used.

First, an aluminum nitride substrate was used as the substrate 12, and the electrode 14 (anode) and the electrode 16 (cathode) were formed using gold on the surface of the substrate. The semiconductor light-emitting element 18 used was a 1 mm square LED with an emission peak of 405 nm (MvpLED™SL-V-U40AC, manufactured by SemiLEDs Corporation). A silver paste (84-1LMISR4, manufactured by Ablestik Company) was added dropwise onto the electrode 14 (anode) using a dispenser, and the lower surface of the LED was bonded to the electrode 14 with the paste. The silver paste was cured under a 175° C. environment for 1 hour. The wire 22 used was a Φ45 μm gold wire. The gold wire was bonded to the upper-side electrode of the LED and the electrode 16 (cathode) by ultrasonic thermocompression bonding. One of the different phosphors or a mixture of two or more of the different phosphors was mixed at 1.4 vol % into a silicone resin (JCR6126, manufactured by Dow Corning Toray Silicone Co., Ltd.) as a binder material, so that a phosphor paste was formed. Subsequently, the phosphor paste was applied to the upper surface of the semiconductor light-emitting element 18 to form a hemispheric dome with a radius of 5 mm, and then cured under a 150° C. environment for 1.5 hours, so that it was fixed to form the dome-shaped phosphor layer 24.

The light-emitting devices of the example and the comparative example were prepared using the phosphors and the light-emitting device structure described above, Phosphor 13 prepared as described below was used as the second phosphor whose color was complementary to that of the first phosphor.

Phosphor 13

Phosphor 13 is a phosphor represented by $(Ca_{4.67}Mg_{0.5})(PO_4)_3Cl:Eu_{0.08}$. Phosphor 13 is an example of the second phosphor. Phosphor 13 was produced as described below. First, the raw materials $CaCO_3$, $MgCO_3$, $CaCl_2$, $CaHPO_4$, and $Eu_2O_3$ were each weighed so that the molar ratio of them was $CaCO_3:MgCO_3:CaCl_2:CaHPO_4:Eu_2O_3=0.42:0.5:3.0:1.25:0.04$, and the weighed raw materials were each added to an alumina mortar and ground and mixed for about 30 minutes, so that a raw material mixture was obtained. The raw material mixture was placed in an alumina crucible and baked under an $N_2$ atmosphere containing 2 to 5% $H_2$ at a temperature of from 800° C. to less than 1,200° C. for 3 hours, so that a baked product was obtained. The resulting baked product was thoroughly washed with warm pure water, so that phosphor 13 was obtained.

Example

In this example, phosphors 1 and 13 were used as the first and second phosphors, respectively, and a light-emitting device was prepared using a phosphor paste containing mixture of them. In this example, a phosphor mixture of phosphors 1 and 9 (2:1 in weight ratio) was used.

Comparative Example

In this comparative example, phosphors 6 and 13 were used as the first and second phosphors, respectively, and a light-emitting device was prepared using a phosphor paste containing a mixture of them. In this example, a phosphor mixture of phosphors 6 and 9 (2:1 in weight ratio) was used.

Section 91.01

Example Evaluation

In an integrating sphere, a current of 350 mA was allowed, to flow through the light-emitting device of each of the example and the comparative example so that light was emitted from it, and the luminous flux ratio and optical spectrum of the emission were measured with a spectrometer (CAS140B-152, manufactured by Instrument Systems Corporation). The results of the measurement are described in detail below.

Table 6 shows the luminous flux ratio and chromaticity coordinate (Cx,Cy) of the emission obtained when a driving current of 350 mA was applied to each light-emitting device. The luminous flux ratio of the emission is indicated by the relative value obtained when the luminous flux upon application of the 350 mA driving current to the light-emitting device, of the comparative example is normalized as 100.

Figure 7:
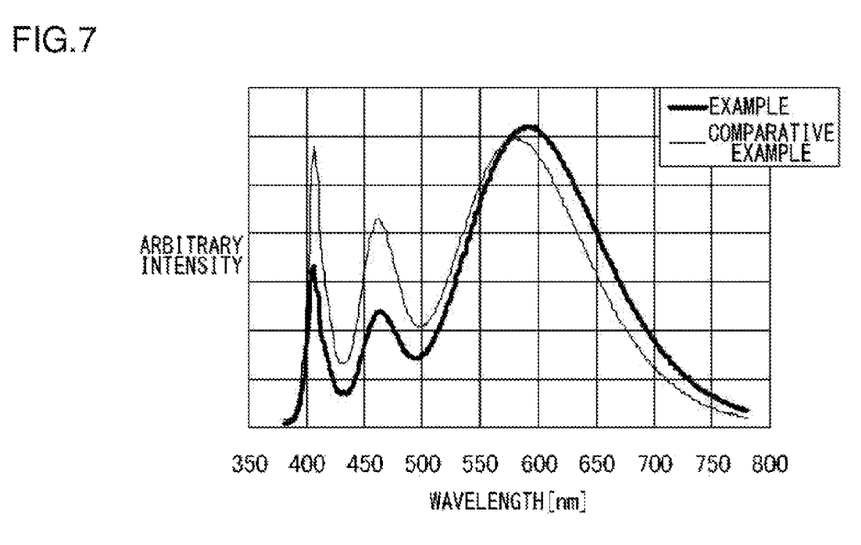
FIG. 7 is a chart showing the emission spectra of the light-emitting devices of an example and a comparative example.

FIG. 7 is a chart showing the emission spectra of the light-emitting devices of the example and the comparative example.

TABLE 6

| | CHROMATICITY COORDINATE | | COLOR TEMPERATURE [K] | LUMINOUS FLUX RATIO |
|---|---|---|---|---|
| | Cx | Cy | | |
| EXAMPLE | 0.438 | 0.414 | 3060 | 97% |
| COMPARATIVE EXAMPLE | 0.385 | 0.379 | 3901 | 100% |

Figure 8:
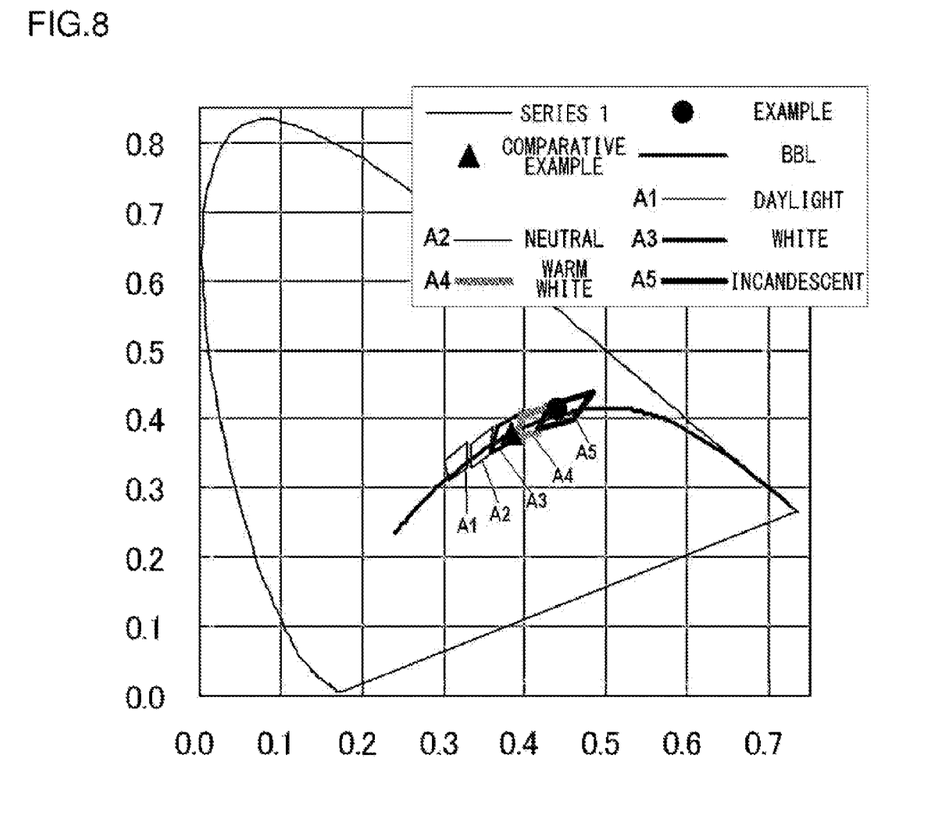
FIG. 8 is a chart showing the chromaticity coordinate of the light emitted from each of the light-emitting devices of an example and a comparative example on the chromaticity diagram.
Figure 9:
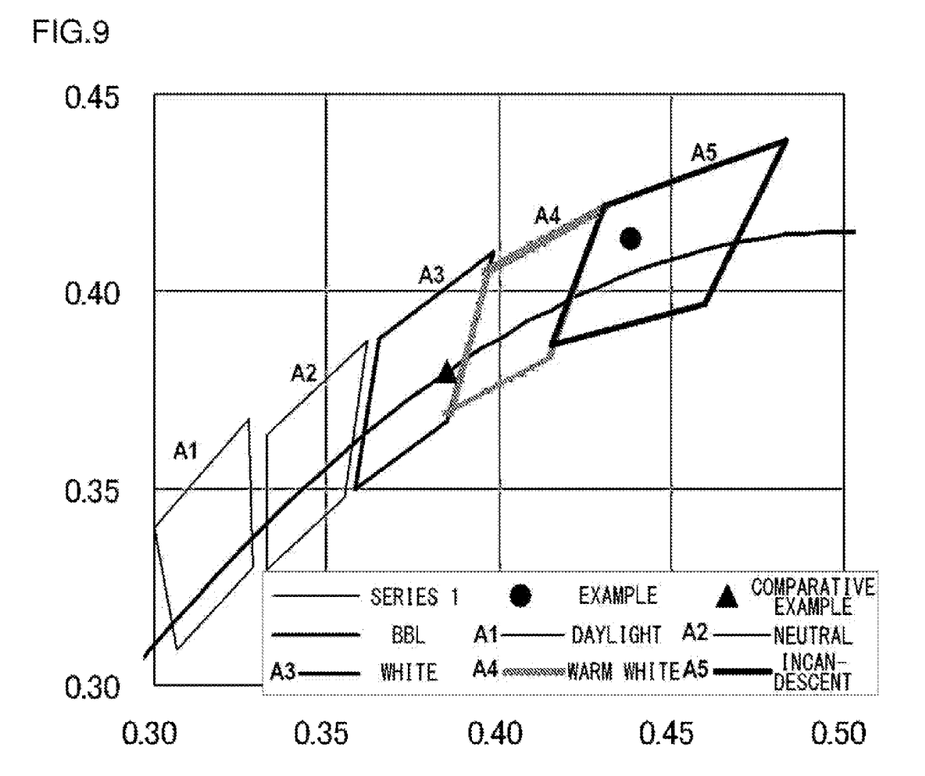
FIG. 9 is a magnified view of part of FIG. 8.

Table 6 shows that although emitting light of incandescent color with a color temperature of about 2,800 K to about 3,200 K) with relatively low luminosity factor, the light-emitting device of the example produces luminous flux at the same level as the light-emitting device of the comparative example, which emits light of white with relatively high luminosity factor. FIG. 8 is a chart showing the chromaticity coordinate of light emitted from each of the light-emitting devices of the example and the comparative example, on the chromaticity diagram. FIG. 9 is a magnified view of part of FIG. 8. In the drawings, regions A1 to A5 indicate the standard chromaticity regions according to the classification of fluorescent lamps. In FIGS. 8 and 9, the chromaticity coordinates of the example and the comparative example are indicated by a solid circle, and a solid triangle, respectively, and the chromaticity coordinate of the light emitted from the light-emitting device of the example falls within the standard chromaticity region of incandescent color (region A5).

The light-emitting device according to this embodiment includes a semiconductor light-emitting element 18 which emits ultraviolet light or short-wavelength visible light, a first phosphor which is excited by ultraviolet light or short-wavelength visible light to emit yellow light, and a second phosphor which is excited by ultraviolet light or short-wavelength visible light to emit blue light, and is configured to emit light, with a color temperature of from 2,800 K to 3200 K by using light from each phosphor.

Conventional light-emitting devices that are produced with semiconductor practically applicable. However, the light-emitting device according to this embodiment can emit light of incandescent color with a relatively low color temperature with a power consumption lower than that of conventional incandescent or fluorescent lamps, because it includes a semiconductor light-emitting element as a light source and two phosphors which are excited by light from the light source to emit light, and is configured to emit light with a color temperature of from 2,800 K to 3,200 K. This light-emitting device can also provide sufficient emission intensity even through it is produced using the first phosphor having an emission spectrum peak wavelength shifted to the long-wavelength side relative to the peak wavelength of the luminosity curve. Therefore, the light-emitting device according to this embodiment can emit light with an illuminance of 100 luxes (lx) or more. It will be understood that it may be configured to emit light preferably with an illuminance of 300 luxes or more, more preferably with an illuminance of 500 luxes or more. This allows it to be used in a wide variety of illumination applications. The light-emitting device according to this embodiment may also be configured to emit light so that an illuminance of 50 luxes or more can be provided at a place 70 cm away from the device when a power of 1 W is supplied to the device.

The invention has been described above with reference to embodiments and examples, it will be understood by those skilled in the art that the embodiments are by way of example only and that each component, each treatment process, and the combinations thereof may be modified in various ways and such modifications also fall within the scope of the invention.

The light-emitting device of the invention can be used in a variety of lighting devices such as lightning fixtures, displays, vehicle lights, and signals.

What is claimed is:

1. A light-emitting device, comprising:
   a light-emitting element which emits ultraviolet light or short-wavelength visible light;
   a first phosphor which is excited by the ultraviolet light or the short-wavelength visible light to emit visible light; and
   a second phosphor which is excited by the ultraviolet light or the short-wavelength visible light to emit visible light of a color different from that of the visible light emitted from the first phosphor,
   the light-emitting device being configured to produce a mixed color by mixing light beams from the respective phosphors and configured to emit light with a color temperature of 3,200 K or less, wherein
   the first phosphor has the general formula $(M^2_x, M^3_y, M^4_z)_m M^1 O_3 X_{(2/n)}$, wherein $M^1$ represents at least one element including at least Si and selected from the group consisting of Si, Ge, Ti, Zr, and Sn, $M^2$ represents at least one element including at least Ca and selected from the group consisting of Ca, Mg, Cd, Co, and Zn, $M^3$ represents at least one element including at least Sr and selected from the group consisting of Sr, Ra, Ba, and Pb, X represents at least one halogen element, $M^4$ represents at least one element including at least $Eu^{2+}$ and selected from the group consisting of rare-earth elements and Mn, m is in the range $1 \leq m \leq 4/3$, n is in the range $5 \leq n \leq 7$, and x, y, and z are each in such a range as to satisfy $x+y+z=1$, $0.45 \leq x \leq 0.8$, $0.05 \leq y \leq 0.45$, and $0.03 \leq z \leq 0.35$.

2. A light-emitting device, comprising:
   a semiconductor light-emitting element which emits light of a wavelength range where a peak wavelength is that of ultraviolet light or short-wavelength visible light;
   a yellow phosphor which is excited by the ultraviolet light or the short-wavelength visible light to emit visible light; and
   a blue phosphor which is excited by the ultraviolet light or the short-wavelength visible light to emit visible light of a color different from that of the visible light emitted from the yellow phosphor,
   the light-emitting device being configured to emit light with a color temperature of 3,200 K or less by using light from each phosphor.

3. The light-emitting device according to claim 2, which is further configured to emit light so that an illuminance of 50 lx or more can be provided at a place 70 cm away from the device when a power of 1 W is supplied to the device.

4. The light-emitting device according to claim 2, wherein the color temperature is from 2,800 K to 3,200 K.

* * * * *